(12) United States Patent
Rach et al.

(10) Patent No.: US 7,309,550 B2
(45) Date of Patent: Dec. 18, 2007

(54) PHOTOSENSITIVE COMPOSITION WITH LOW YELLOWING UNDER UV-LIGHT AND SUNLIGHT EXPOSURE

(75) Inventors: Joe F. Rach, Suwanee, GA (US); Krasimir Chorbadzhiev, Alpharetta, GA (US)

(73) Assignee: Chemence, Inc., Alpharetta, GA (US)

( * ) Notice: Subject to any disclaimer, the term of this patent is extended or adjusted under 35 U.S.C. 154(b) by 0 days.

(21) Appl. No.: 11/644,109

(22) Filed: Dec. 22, 2006

(65) Prior Publication Data

US 2007/0099119 A1 May 3, 2007

(51) Int. Cl.
*G03F 7/031* (2006.01)

(52) U.S. Cl. .............. 430/18; 430/284.1; 430/916; 430/306

(58) Field of Classification Search .............. None
See application file for complete search history.

(56) References Cited

U.S. PATENT DOCUMENTS

| | | | |
|---|---|---|---|
| 2,760,863 A | 8/1956 | Plambeck | |
| 3,850,770 A | 11/1974 | Juna et al. | |
| 3,960,572 A | 6/1976 | Ibata et al. | |
| 4,006,024 A | 2/1977 | Ibata et al. | |
| 4,057,431 A | 11/1977 | Finelli et al. | |
| 4,264,705 A | 4/1981 | Allen | |
| 4,279,720 A * | 7/1981 | Berner | 522/14 |
| 4,490,410 A * | 12/1984 | Takiyama et al. | 427/504 |
| 5,011,635 A * | 4/1991 | Murphy et al. | 264/401 |
| 5,204,222 A | 4/1993 | Gersdorf et al. | |
| 5,228,771 A | 7/1993 | Zimmerman | |
| 5,587,405 A * | 12/1996 | Tanaka et al. | 522/98 |
| 5,688,633 A | 11/1997 | Leach | |
| 6,048,660 A | 4/2000 | Leppard et al. | |
| 6,095,046 A | 8/2000 | Lookholder et al. | |
| 6,214,522 B1 | 4/2001 | Leach | |
| 6,248,804 B1 * | 6/2001 | Lutz | 523/160 |
| 6,562,464 B1 | 5/2003 | Schwalm et al. | |
| 6,602,601 B2 | 8/2003 | Fewkes et al. | |
| 6,740,365 B2 | 5/2004 | Awokola et al. | |
| 6,777,459 B2 | 8/2004 | Al-Akhdar et al. | |
| 6,829,362 B1 * | 12/2004 | Kadziela et al. | 381/312 |
| 7,084,183 B2 | 8/2006 | Fuchs et al. | |

FOREIGN PATENT DOCUMENTS

| | | |
|---|---|---|
| JP | 2006171261 A | 6/2006 |
| WO | WO2005/076074 | 8/2005 |
| WO | WO2005/100291 A1 | 10/2005 |
| WO | WO2005/100292 A1 | 10/2005 |

\* cited by examiner

*Primary Examiner*—Cynthia Hamilton
(74) *Attorney, Agent, or Firm*—Thomas, Kayden, Horstemeyer & Risley, LLP (57) ABSTRACT

This disclosure relates to a photosensitive composition useful in preparing water-developable, relief printing plates and other photosensitive articles. The compositions comprise an unsaturated polyurethane pre-polymer, which is the reaction product of at least one polyether diol, at least one aliphatic diisocyanate, at least one hydroxyl-functionalized mono-, di- and tri-(meth)acrylate, and a particular photoinitiator. The resulting photosensitive resin compositions have reduced rates and levels of yellowing if subjected to additional UV-light or sunlight after processing.

9 Claims, 6 Drawing Sheets

PHOTOSENSITIVE COMPOSITION WITH LOW YELLOWING UNDER UV-LIGHT AND SUNLIGHT EXPOSURE

FIELD OF THE DISCLOSURE

The disclosure relates to photocurable, storage-stable, negative working mixtures and a recording material, obtained therefrom, which is suitable for the production of soft elastic relief printing plates and other photosensitive or radiation sensitive articles.

BACKGROUND OF THE DISCLOSURE

In relief printing, e.g., hand stamps, ink is transferred to a substrate by using a raised relief printing plate that is usually inked by contact with a liquid inkpad. The surface of the plate is created so that the image to be transferred appears in relief, in the same way that rubber stamps are cut so as to have the printed image appear in relief on the surface of the rubber. Typically, the plate is mounted on a wooden block such that the raised surface of the printing plate can be contacted to an inkpad and the raised relief image transferred to the substrate, thereby transferring ink from the raised surface of the plate to the substrate to form a printed substrate.

In recent years a wide variety of materials have been introduced in the market to manufacture hand stamps. There has been a notable increase in the use of photopolymerized materials to replace the traditional rubber. Other advances have simultaneously occurred in the type of mounting materials used. In particular, the use of clear acrylic mounting blocks, which enables the user to "see through the stamp" has encouraged the need for photosensitive resin compositions, which are essentially substantially transparent and able to maintain this transparency for the packaged life of the article.

In addition to the need for transparency, the hand stamp material should have sufficient softness to readily transfer the image (without distortion), have an image surface that has adequate chemical resistance towards the aqueous-based ink or alcohol-based ink that is normally used in stamp pads. It is further desired that the physical and printing properties of the hand stamp are stable and do not change during printing or storage.

Photopolymer resin compositions generally include an elastomeric binder, at least one monomer, a photoinitiator, and a free radical stabilizer. Optionally they may contain colorants or other additives to modify performance e.g., ultraviolet or humidity stabilizers, tack reducing agents, etc. Compositions capable of being converted under the influence of actinic light to solid, insoluble, tough structures are well-known and have become increasingly important in the preparation of printing plates. One of the fundamental patents relating to such compositions is U.S. Pat. No. 2,760,863 to Plambeck. In the process of the Plambeck patent, printing plates are produced directly by exposing to actinic light through an image-bearing process transparency a layer of an essentially transparent composition containing an addition polymerizable, ethylenically unsaturated monomer and an addition polymerization initiator activated by actinic light. The layer of polymerizable composition is supported on a suitable support, and exposure of the composition is continued until substantial polymerization of the composition has occurred in the exposed areas with substantially no polymerization occurring in the non-exposed areas. The unchanged material in the latter areas is removed, as by treatment with a suitable solvent in which the polymerized composition in the exposed areas is insoluble. This results in a raised relief image that corresponds to the transparent image of the transparency and that is suitable for use as a printing plate, as in letterpress and dry off-set work.

Liquid photopolymer hand stamps are generally formed by first pouring a photo-curable layer over a thin transparent plastic sheet (Cover film) placed over the image bearing surface such as a photographic negative. A second, thicker polyester transparent sheet is laminated over the resin to form the encapsulated photo-imageable material, which is sandwiched between to transparent pieces of glass equipped with sources of actinic radiation. Upon stepwise exposure to the actinic radiation, the exposed layer hardens in the exposed areas. Brushing or spraying the imaged material after removing the cover film with the aid of a suitable aqueous developer removes the unexposed areas of the photo-hardened layer leaving a printing relief which can be used for hand stamps.

Photosensitive compositions based on the reaction of polyols and diisocyanates to produce an acrylate or methacrylate terminated polyurethane oligomers diluted with various acrylate or methacrylate monomers are known. However, current photosensitive compositions used to make relief printing plates, such as hand stamps, suffer from yellowing upon exposure to ultraviolet light and sunlight.

SUMMARY OF THE INVENTION

Photo-curable polymers and compositions are well known in the art for forming printing plates and other photosensitive or radiation sensitive articles. This disclosure relates to novel photosensitive compositions, specifically to compositions that are polymerizable by actinic light and that after processing, maintain their clarity. These compositions have been formulated to reduce the amount of yellowing that normally occurs with this type of photosensitive article when subjected to sunlight or left exposed to actinic light from overhead lamps for extended periods of time.

The present disclosure provides photosensitive resin compositions, providing low yellowing of cured articles (e.g., raised relief images, such as a printing plate) after processing and exposure to UV-light or sunlight. Embodiments of compositions of the present disclosure include the following:

a) at least one aliphatic polyether urethane (meth)acrylate oligomer having in average of approximately 2.0 (meth)acrylates groups per molecule, suitably in an amount of about 50 to 75% by weight of the total composition;

b) at least one reactive diluent(s)-mono-, di- and poly-(meth)acrylate esters, suitably in amount of about 20 to 50% by weight of the total composition; and.

c) at least one photoinitiator selected to provide low yellowing, suitably in amount of about 0.1 to 10% by weight of the total composition.

Compositions of the present disclosure may also include other additives, including but not limited to the following: stabilizers, antioxidants, anti-ozonates and UV-stabilizers, suitably in an amount of about 0.01 to 4% by weight of the total composition.

In particular, embodiments of the photosensitive resin compositions of the present disclosure include a photoinitiator of Formula (I), (II), or (III), below.

In Formulas (I), (II), and (III), Ar is an unsubsituted $C_6$-$C_{14}$-aryl radical or a mono-, di-, or tri-substituted $C_6$-$C_{14}$-aryl radical, where each substitution is independently selected from: a $C_1$-$C_4$-alkyl, a $C_1$-$C_4$-alkoxy, a phenoxy, a $C_1$-$C_4$-alkylthio, a phenylthio, and a halogen; and R is selected from a $C_1$-$C_{12}$-alkyl, a $C_5$-$C_6$-cycloalkyl, a $C_6$-$C_{10}$-aryl, a $C_6$-$C_{10}$-alkaryl, and a $C_3$-$C_6$ alkoxyalkyl.

The present disclosure also provides methods of using the photosensitive compositions to make cured articles, particularly raised relief image articles, such as printing plates, hand stamps, and the like. Methods of the present disclosure also include methods of making cured articles using the photosensitive compositions of the present disclosure.

Other features and advantages of the disclosed composition will be or become apparent to one with skill in the art upon examination of the following drawings and detailed description. It is intended that all additional features and advantages included within this description, be within the scope of the present invention, and be protected by the accompanying claims.

BRIEF DESCRIPTION OF THE DRAWINGS

The disclosure can be better understood with reference to the following drawings. The components in the drawings are not necessarily to scale, emphasis instead being placed upon clearly illustrating the principles of the present disclosure.

DETAILED DESCRIPTION OF THE DISCLOSURE

Embodiments of the present disclosure will employ, unless otherwise indicated, conventional techniques of synthetic organic chemistry, and the like, which are within the skill of one in the art. Such techniques are explained fully in the literature.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

The following examples are put forth so as to provide those of ordinary skill in the art with a complete disclosure and description of how to perform the methods and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that unless otherwise indicated the present disclosure is not limited to particular materials, reagents, reaction materials, manufacturing processes, or the like, as such may vary. It is also to be understood that the terminology used herein is for purposes of describing particular embodiments only, and is not intended to be limiting. It is also possible in the present disclosure that steps may be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Briefly described, the photosensitive resin composition of the present disclosure includes a urethane oligomer, ethylenically unsaturated compounds, and a photopolymerization initiator. In some embodiments the photosensitive resin composition may include other additives, such as, but not limited to stabilizers, antioxidants, anti-ozonates, UV-stabilizers, and the like. The various components of the photosensitive composition are described in greater detail below.

Polyether Urethane Acrylates

The aliphatic polyether urethane (meth)acrylate compounds useful in the disclosure are suitably prepared by reacting an aliphatic diisocyanate with one or more polyether or polyester diols.

Preferably, the ratio used is about 1.0-2.0 isocyanate groups per hydroxyl group of the polyether diol compound (mixture). The remaining isocyanate groups are then reacted with a suitable hydroxyalkyl (meth)acrylate compound to produce the (meth)acrylated oligomer.

The reaction can also be run in reverse sequence, first preparing (meth)acrylate functional isocyanate intermediates and then subsequent reaction with polyether or polyester diols.

Typically, the aliphatic polyether urethane (meth)acrylate compounds form from about 40 to 80 weight percent of the photosensitive composition of the present disclosure, more preferably, they form from about 50 to 75 weight percent.

Polyether Diols

The poly(alkylene oxide) polyols that can be employed in the practice of this disclosure are compounds normally obtained from the polymerization, including block-polymerization, of cyclic ethers such as alkylene oxides, dioxolane and tetrahydrofuran, or the condensation of cyclic ethers with glycols.

They are well-known articles of commerce, and are also called polyglycols, polyalkylene glycols, or polyalkylene oxide glycols.

Preferred polyether diols are ethylene oxide, propylene oxide polymer or co-polymers with hydroxyl functionality at about 2.0 hydroxy groups per molecule and low level of unsaturation.

In order to produce a photopolymer resin having a viscosity appropriate for easy manufacture of printing plates and hand stamps with appropriate hardness, tensile strength, elongation and resilience, it is preferred to use polyether diols having a number average molecular weight from about 500 to 5000 Da. More preferable, the number average molecular weight of each polyether diol will be above about 1500 to 4500 Da.

Polyester Diols

Suitable polyester diols include, but are not limited to, those made from dibasic acids or caprolactones with an excess of glycol. The dibasic acids, which are preferred, are those of the saturated series with 2-22 carbon atoms in the aliphatic moiety, such as succcinic, glutaric, adipic, pimelic, and suberic acids, and the like. Aromatic dibasic acids, their anhydrides (e.g., phthalic anhydride), or their esters (e.g., methyl terephthalate) may be used.

Suitable glycols for making polyester diols include the alkylene glycols (e.g., ethyleneglycol, propyleneglycol, trimethyleneglycol, tetramethyleneglycol and isobutyleneglycol) or mixtures thereof.

Preferably the average molecular weight of the polyester diol employed in the present disclosure is above about 1000 to 5000 Da.

Aliphatic Diisocyanates

A second component used to prepare the urethane oligomer is a polyisocyanate. A preferred polyisocyanate is a diisocyanate, e.g. a molecule having exactly two isocyanate groups, and optionally other functional groups as well. To prepare a urethane oligomer, it is preferred to contact the polyisocyanate with the diol compounds to prepare an intermediate polyurethane oligomer, which is then contacted with hydroxy-functionalized acrylate or methacrylate.

A preferred diisocyanate used to prepare the polyurethane oligomers of the disclosure is an aliphatic, including cycloaliphatic diisocynates.

Suitable aliphatic diisocyanates include, for example, molecules having 2 to 12 carbon atoms in the aliphatic radical, for example, ethylene diisocyanate, propylene diisocyanate, tetramethylene diisocyanate, hexamethylene diisocyanate, 2,2,4-trimethylhexamethylene diisocyanate and the like.

Preferred cycloaliphatic diisocyanates are, for example 1,4-diisocyanato-cyclohexane, dicyclohexylmethane-4,4'-diisocyanate, isophorone diisocyanate, norbornanediisocyanate (2,5(2,6)-Bis(isocyanatomethyl)bicycle[2.2.1]heptane) and the like.

It is preferred to react the polyisocyanate in substantially equivalent excess with the diol compounds, in order that an intermediate polyurethane oligomer having isocyanate termination is produced. The molar ratio between [OH]—hydroxyl groups of diols compounds and [NCO]—isocyanate groups of polyisocyanate compounds is preferably between about 1.0:1.08 and 1.0:1.5, and more preferably between about 1.0:1.1 and 1.0:1.3. Conventional urethane-forming catalyst may be used in the reaction between polyisocyanate and diol compounds. These catalysts used include, e.g., organo-tin compounds such as dibutyl tin dilaurate and stannous octoate, organomercury compounds, tertiary amines, and mixture of these materials. A preferred reaction temperature is about 60° C. to 80° C., and a preferred reaction time is approximately 1.0 to 4.0 hours.

Hydroxyalkyl (meth)acrylates

The isocyanate-terminated oligomer is further reacted with a hydroxyl acrylate, hydroxyl methacrylate or mixtures thereof to form the ethylenically unsaturated polyurethane prepolymer. Suitable hydroxyl acrylates or methacrylates include, but are not limited to: 2-hydroxypropyl methacrylate, polypropylene glycol monomethacrylate, and acrylated caprolactone oligomers. Polypropylene glycol monomethacrylate, hydroxypropyl methacrylate, or mixtures of the foregoing are preferred.

Reactive Monomers

Additional components of the photosensitive resin composition of the disclosure are known as reactive monomers. The monomers may include mono-, di- and polyhydric-acrylic or methacrylic acid esters.

The incorporation of compounds having two or more ethylenicaly unsaturated groups in the molecule into photosensitive resin formulation increases the hardness of the printing plates made therefrom. Therefore, the amount of such compound in the photosensitive resin composition can be controlled to obtain the desired hardness of the printing plate.

Typically, the monomers form from about 10 to about 50 weight percent of the photopolymer resin, and more preferably from about 20 to about 35 weight percent.

The proportion of monomers in the formulation controls the viscosity of the resulting liquid photosensitive resin. The viscosity is preferably between about 20,000 and 50,000 cps.

The monomers include, for example and without limitation: butyl-acrylate or methacrylate, 2-ethylhexyl-acrylate or methacrylate, isodecyl-acrylate or methacrylate; lauryl-acrylate or methacrylate; phenoxyethoxy-acrylate or methacrylate; 2-hydroxyethyl-acrylate or methacrylate; ethylene glycol-diacrylate or dimethacrylate; di-, tri- and tetra-ethylene glycol diacrylates or dimethacrylates; hexane-1,6-diol diacrylate or dimethacrylate; tripropylene glycol diacrylate or dimethacrylate; pentaerythritol tetra acrylate or methacrylate, ethoxylated or propoxylated trimethylolpropane mono-, di- and tri-acrylates or methacrylates; and esters of oligomeric polybutadiene diols with acrylic or methacrylic acid.

Preferred monomers are polypropyleneglycol monomethacrylate, laurylmethacrylate, diethyleneglycol dimethacrylate, tripropyleneglycol diacrylate, and trimethylolpropane trimethacrylate.

Photoinitiators

A third component of the photosensitive resin composition of the present disclosure is the photoinitiator. The inclusion of one or more photoinitiators is important for controlling the yellowing of the cured article upon exposure to ultraviolet light and/or sunlight. The particular photoinitiators of the present disclosure significantly reduce the yellowing of cured articles produced with the photosensitive resin compositions of the present disclosure, as demonstrated in the examples below and related figures.

The different classes of photoinitiators that can be used in the present disclosure include, but are not limited to, benzoin and benzoinether derivatives, benzyl ketal derivatives, α, α-dialkyloxyacetophenone derivatives, α-hydroxyalkylphenone derivatives, α-aminoalkylphenone derivatives, acylphosphine oxide, acyl phosphine sulfides, α-ketocarboxylic acids and their esters, aromatic α-ketocarboxylic acids and their esters, O-acyl-α-oximino ketone derivatives, benzophenone and its derivatives, Michler's ketone, thioxanthone and its derivatives, methalocene compounds, bisimidazole and their derivatives and all the polymer-bond compounds of the type mentioned above.

In particular, preferred photoinitiators for use in the photosensitive compositions of the present disclosure have one of the following formulas:

Formula I

Formula II

Formula III

In Formulas (I), (II), and (III), Ar is an unsubstituted $C_6$-$C_{14}$-aryl radical or a mono-, di-, or tri-substituted $C_6$-$C_{14}$-aryl radical, where each substitution is independently selected from: a $C_1$-$C_4$-alkyl, a $C_1$-$C_4$-alkoxy, a phenoxy, a $C_1$-$C_4$-alkylthio, a phenylthio, and a halogen; and R is selected from a $C_1$-$C_{12}$-alkyl, a $C_5$-$C_6$-cycloalkyl, a $C_6$-$C_{10}$-aryl, a $C_6$-$C_{10}$-alkaryl, and a $C_3$-$C_6$ alkoxyalkyl.

The preferred photoinitiators are among the group of aromatic α-ketocarboxylic acid and their esters. The group of α-ketocarboxylic acids includes, for example and without limitation: methyl phenylglyoxylate, ethyl phenylglyoxylate, benzyl phenylglyoxylate, 2-ethylhexyl phenylglyoxylate, phenyl phenylglyoxylate, 2-ethoxyethyl phenylglyoxylate, ethyl p-chlorophenylglyoxylate, ethyl p-phenoxyphenylglyoxylate, methyl m-methoxy phenylglyoxylate, methyl p-iso-propyl phenylglyoxylate, methyl p-methylthiophenylglyoxylate, butyl o-tolyl-glyoxylate, hexyl 2-naphthylglyoxylate.

The most preferable photoinitiators are the esters of aromatic α-ketocarboxylic acids including, but not limited to, mono-, di- and polyhydric-ester of phenylglyoxylic acid or phenylglyoxylic acid derivatives, for example and without limitation, ethylene glycol mono- and di-esters of phenylglyoxylic acid, triethylene glycol mono- and di-esters of phenylglyoxylic acid, tetraethylene glycol mono- and di-esters of phenylglyoxylic acid, trimethylolpropane esters of phenylglyoxylic acid, pentaerythritol esters of phenylglyoxylic acid, 1,4-butanediol-diglycidyl esters of phenylglyoxylic acid, 1,4-cyclohexanediol esters of phenylglyoxylic acid, 1,4-cyclohexanedimethanol esters of phenylglyoxylic acid, 4,4'-izopropylidenedicyclohexanol esters of phenylglyoxylic acid.

In certain cases it can be advantageous to use a mixture of 2 or more photoinitiators to include photoinitiators from the preferable group of aromatic α-ketocarboxylic acid esters and photoinitiators from other classes of compounds mentioned above.

Figure 1:
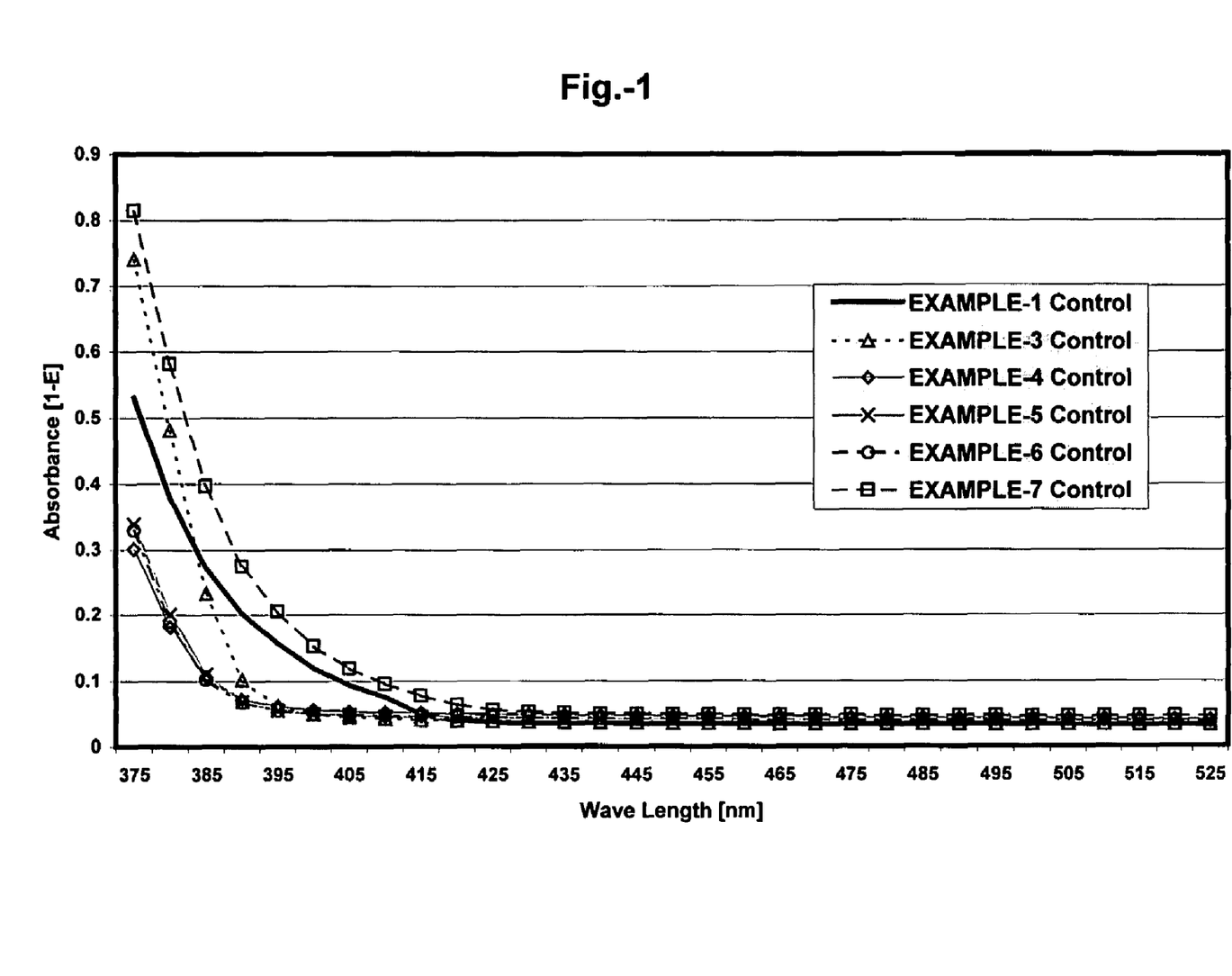
FIG. 1 is a graph representing the UV-VIS spectra between 375 and 525 nm of prepolymers from Examples 1-7 before treatment (control).
Figure 2:
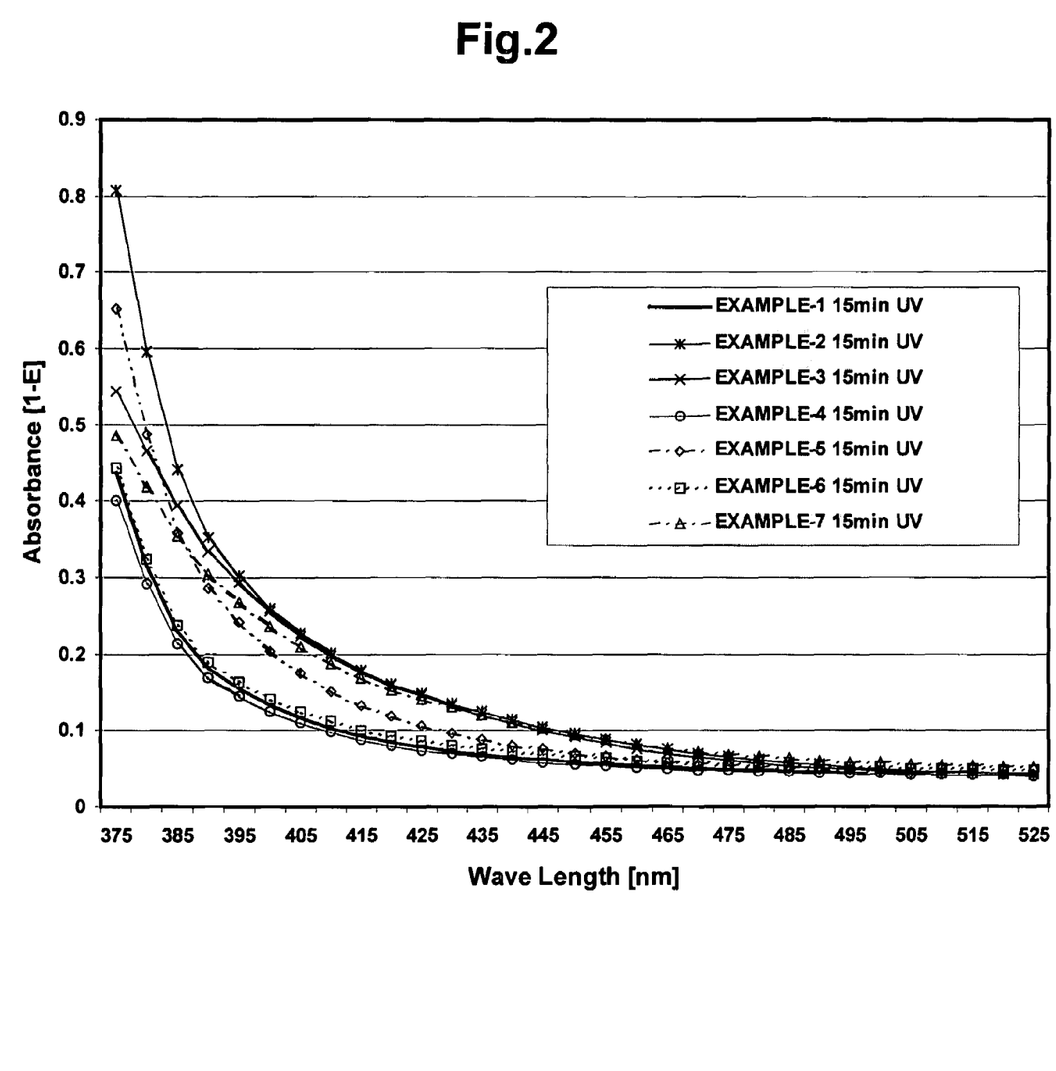
FIG. 2 is a graph representing the UV-VIS spectra between 375 and 525 nm of samples from Examples 1-7 after 15 minutes of exposure under UV-light (75-85 mW/cm$^2$)
Figure 3:
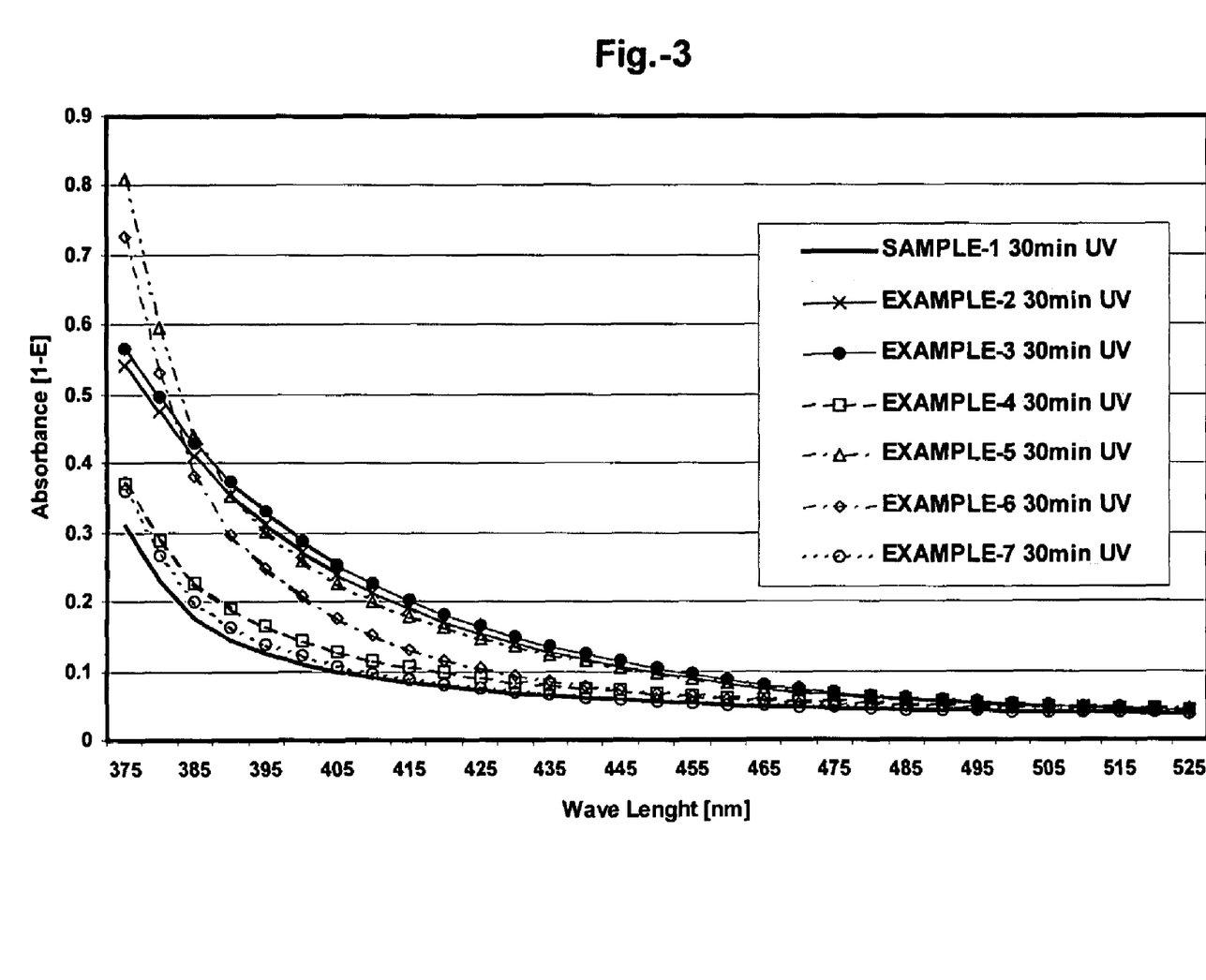
FIG. 3 is a graph representing the UV-VIS spectra between 375 and 525 nm of samples from Examples 1-7 after 30 minutes of exposure under UV-light (75-85 mW/cm$^2$).
Figure 4:
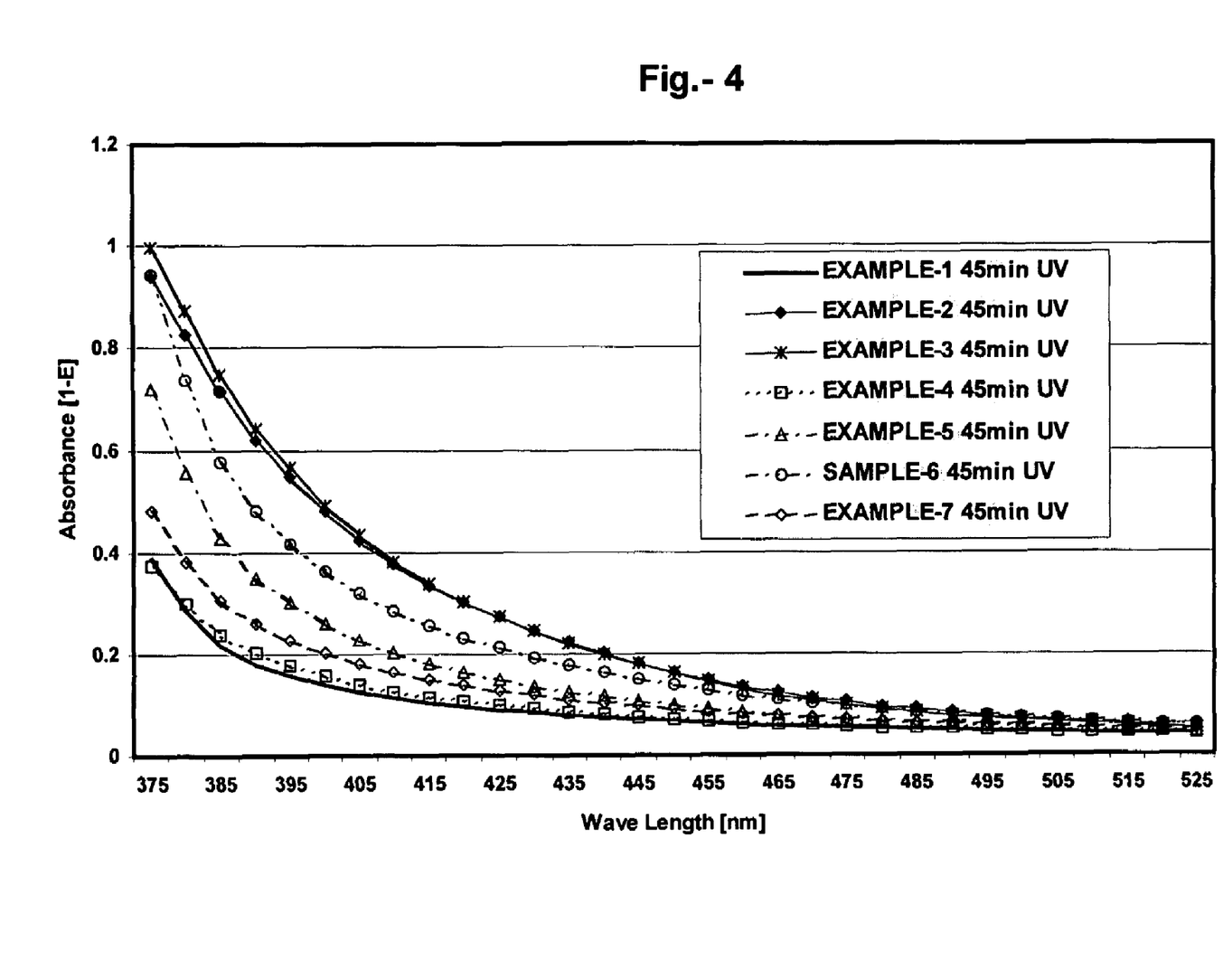
FIG. 4 is a graph representing the UV-VIS spectra between 375 and 525 nm of samples from Examples 1-7 after 45 minutes of exposure under UV-light (75-85 mW/cm$^2$)
Figure 5:
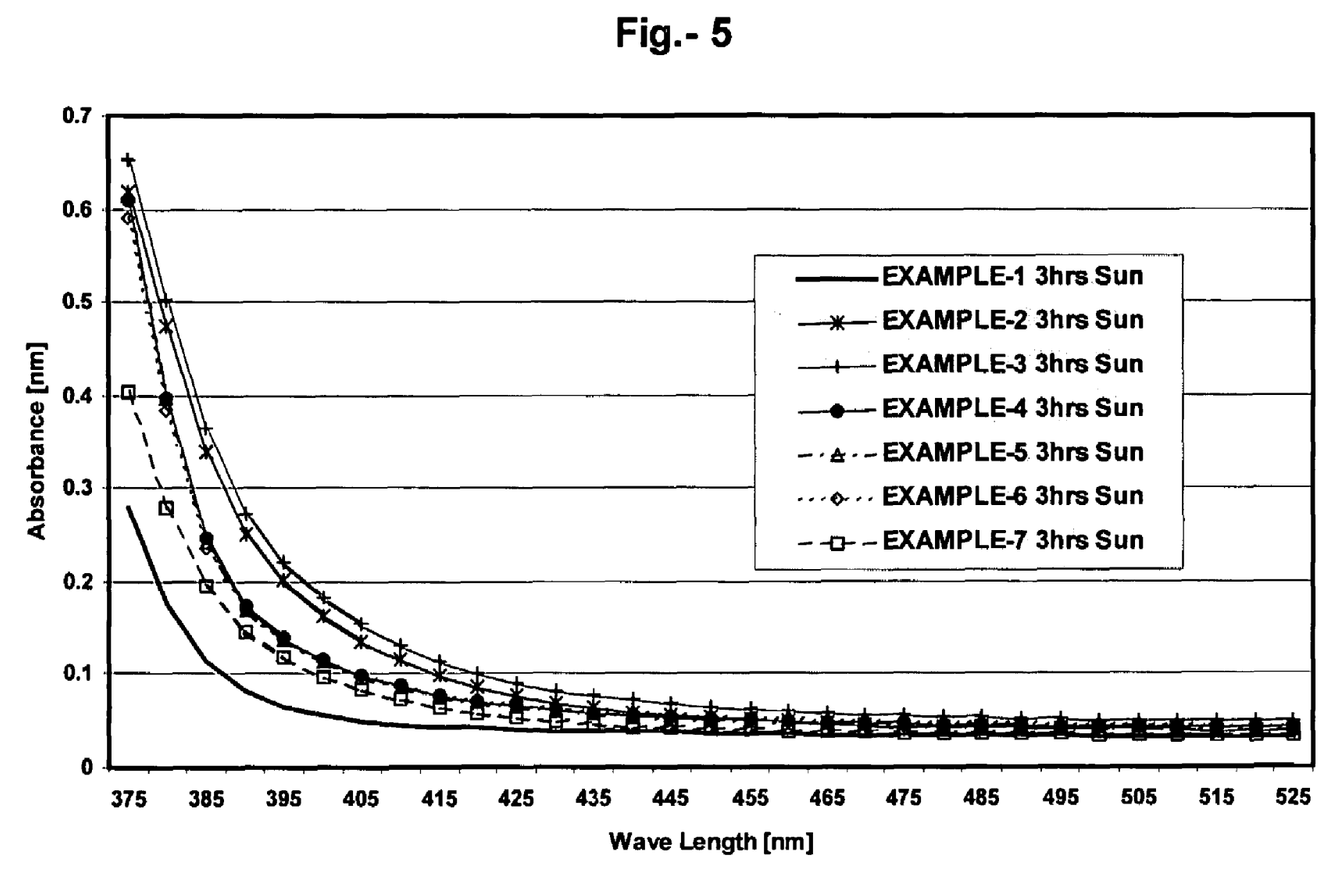
FIG. 5 is a graph representing the UV-VIS spectra between 375 and 525 nm of samples from Examples 1-7 after 3 hours of exposure to sunlight.
Figure 6:
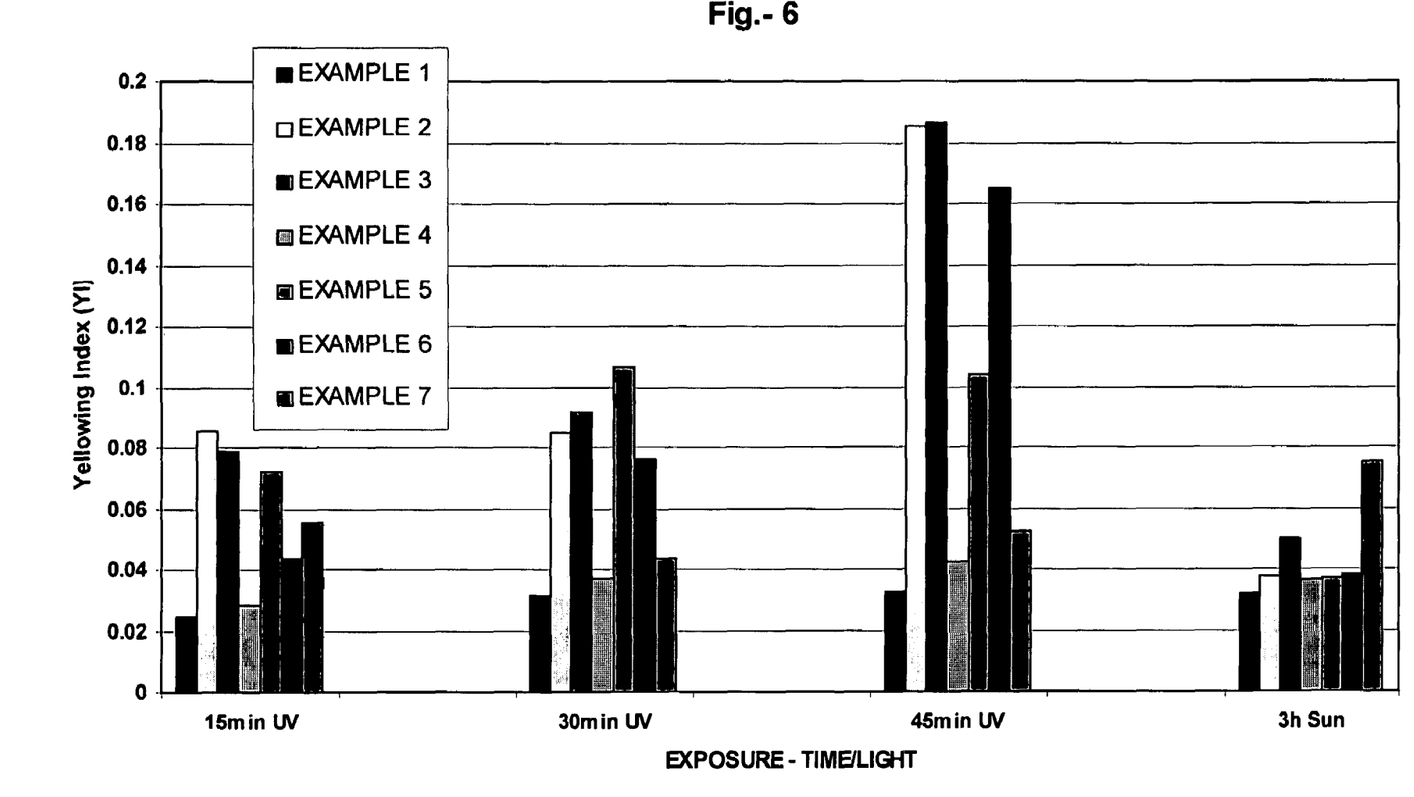
FIG. 6 is a bar graph representing the Yellowness Index calculated from the UV-VIS spectra between 375 and 525 nm of samples from Examples 1-7 after exposure under UV-light and sunlight.

The preferred photoinitiator in the present disclosure is a mixture of triethyleneglycol mono- and di-ester of phenylglyoxylic acid. (Mixture of oxy-phenyl-acetic acid 2-[2oxo-2-phenyl-acetoxy-etyoxy]-ethyl ester and oxy-phenyl-acetic 2-[2-hydroxy-ethoxy]-ethyl ester (photoinitiator trade name IRGACURE 754, Ciba Specialty Chemicals Corp.). This photoinitiator is particularly useful for reducing yellowing, as demonstrated by Example 1, and FIG. 6. Preferably, a mixture of 10-90% Oxy-phenyl-acetic acid 2-[2-oxo-2-phenyl-acetoxy]-ethyl ester and 10-90% -Oxy-phenyl-acetic acid 2-[2-hydroxy-ethoxy]-ethyl ester (Ciba Specialty Chemicals Corp.) is used. Most preferably, a mixture of 30-60% Oxy-phenyl-acetic acid 2-[2-oxo-2-phenyl-acetoxy]-ethyl ester and 40-70%-Oxy-phenyl-acetic acid 2-[2-hydroxy-ethoxy]-ethyl ester (Ciba Specialty Chemicals Corp.) is used.

Preferably, the amount of photoinitiators present in the photosensitive resin composition is from about 0.1 to 10% by weight, and more preferably between 0.2 to 5% by weight.

Additives

The compositions may also include other additives known in the art for use in photocurable compositions, e.g. radical polymerization inhibitors, antioxidants, anti-ozonates and UV-light absorbers.

To inhibit premature crosslinking during storage of the photosensitive resin compositions of this disclosure, thermal polymerization inhibitors and stabilizers may be added. Such stabilizers are well known in the art, and include, but are not limited to, hydroquinone monomethyl ether, hydroquinone monopropyl ether, hydroquinone monobenzyl ether, amyl quinine, amyloxyhydroquinone, n-butylphenol, phenol, phenothiazine, nitrobenzene and phenolic-thio compounds, and mixture thereof.

To protect the photosensitive resin compositions from decomposition by thermal oxidation and oxidation by atmospheric oxygen, effective amounts of conventional antioxidants may be added to the mixture. Antioxidants in use are, for example; sterically hindered mono phenols, such as 2,6-di-tert-butyl-p-cresol (BHT), alkylated thiobisphenols and alkylidenebisphenols, such as 2,2,-bis (1-hydroxy-4-methyl-6-tert-butylphenyl) sulfide or 2,2-methylenebis-(4-methyl-6-tert-butylphenol); hydroxybenzyls; polymerized substituted hydroquinone; dibutylzinc dithiocarbamate; dilauryl thiodipropionate and phosphates.

UV light absorbers, or UV light stabilizers, can be used to adjust the photo speed and, therefore, exposure latitude of the polymer material. Preferred light stabilizers include, but are not limited to: 2-hydroxy-benzophenonones, 2-hydroxyphenyl benzotriazoles, hindered amines and organic nickel compounds. In addition, salicylates, cinnamate derivatives, resorcinol monobenzoates, oxanilides, and p-hydroxy benzoates can be used as well.

Test Procedures

Photo-Polymer Sample Preparation

The plate-making Unit "IDEAL1200" (M&R Market System Inc.) was used. The UV-radiation emitters in "IDEAL1200" are gas discharge tubes. The Intensity of UV-light in "IDEAL 1200" unit between the glass plates was 1.8-2.2 mW/cm$^2$ measured by "Radiometer-Photometer Model IL1400A" (International Light Inc.).

All photopolymer articles were prepared between 0.007 inch thick polyester substrates.

The samples prepared for color changes measurements were 5×5 inch squares and were 0.120-0.125 inches thick.

The samples prepared for estimation of tensile strength and elongation were 5×5 inch squares and were 0.012-0.025 inches thick.

The samples prepared for estimation of shore A hardness and impact resilience were 5×5 inch squares and were 0.22-0.25 inches thick.

The UV-light time exposure used to form the samples was irradiation for 200 seconds from both the top and bottom of the samples.

The Physical Properties

Tensile strength and elongation were measured on precut bells having dimensions 0.05×2.0 inches and a thickness of 0.012-0.02 inch, using an "INSTRON 4301" tension meter (Instron Corporation).

Shore A hardness was evaluated on a Durometer 473 (Pacific Transducer Corp.), and impact resilience was measured on a Resiliometer SR-1 (The Shore Instrument & MFG).

Viscosities of the liquid photo-polymer resins were measured on Brookfield Viscometer RVT in a small sample adapter at 23° C. with spindle #28 at 10 rpm.

UV-Light and Sunlight Exposure Procedure

UV-Light Exposure

2×2 inch (50×50 mm), 0.120-0.125 inch thick (3.0-3.2 mm thick) test specimens were prepared as described above and placed for irradiation. A doped mercury pressure lamp was used as the source of UV radiation. The emission wavelength range was about 180 to 420 nm, particularly 200 to 400. The intensity of the UV-light used was about 75-85 mW/cm$^2$, measured by "Radiometer-Photometer Model IL1400A" (International Light Inc.).

Sunlight Exposure

Additional test specimens 2×2 inch (25×25 mm) and 0.120-0.125 inches thick (3.0-3.2 mm thick) were placed for irradiation under direct sunlight between 11:00 AM and 3:00 PM. The intensity of UV-light was about 2.8 to 3.2 mW/cm$^2$ as measured by "Radiometer-Photometer Model IL1400A" (International Light Inc.).

Color Changes Measurement Procedure

The color changes were measured by UV-VIS spectroscopy using a GENESYS 10 Spectrophotometer (Thermo-Electron Corporation). UV-VIS spectra between 375 and 525 nm were measured on specimen measuring 0.4×1.0 inches and 0.120-0.125 inches in thickness (10×25 mm and 3.0-3.2 mm thickness).

The yellowness Index is calculated by adjusting the average absorbance of the sample specimen by extracting the absorbance of the control sample (sample without treatment) according to the following equation:

$$YI = \sum_{i=n}^{i=n} A(i) - Ac(i)/n$$

Where

YI=Yellowness Index;

n (number of measurement)=(525 nm-375 nm)/5 nm=31

A(i)=absorbance of Sample specimen

Ac(i)=absorbance of Control Sample specimen

The specific examples below are to be construed as merely illustrative and not limitative of the remainder of the disclosure in any way whatsoever. Without further elaboration, it is believed that one skilled in the art can, based on the description herein, utilize the present disclosure to its fullest extent.

Synthesis 1

200 g poly(propylene-ethylene) glycol diol-HO($C_3H_5O$) n($C_2H_5O$) mH (having a number average molecular weight of about 2000 Da) and 200 g polypropylene glycol diol (having number average molecular weight of 3000 Da) were reacted with 59.5 g dicyclohexylmethane-4,4'-diisocyanate (DESMODUR W, Bayer), with purity more than 99.5%, in the presence of 0.180 g dibutyltin dilaurate at 65-75° C. for 2-3 hours with stirring to give an isocyanate terminated polyglycol. The resulting oligomer was further reacted with 40.1 g poly (propylene glycol) monomethacrylate (SR604A, Sartomer) for 2 hours at 70-80° C. with stirring to give a polyurethane PREPOLYMER-1 without un-reacted isocyanate groups and functionalized with unsaturated double bonds of methacrylate groups.

Synthesis 2

200 g poly(propylene-ethylene) glycol diol-HO($C_3H_5O$) n($C_2H_5O$)mH (having a number average molecular weight of about 2000 Da) and 200 g polypropylene glycol diol (having number average molecular weight of 3000 Da) were reacted with 36.7 g of a mixture 2,4-toluene diisocyanate and 2,6-toluene diisocyanate in a weight ratio 80 to 20 (MONDUR TD-80 GradeA, Bayer) in the presence of 0.237 g dibutyltin dilaurate at 65-75° C. for 2-3 hours with stirring to give an isocyanate-terminated polyglycol. The resulting oligomer was further reacted with 38.4 g poly(propylene glycol) monomethacrylate (SR604, Sartomer) for 2 hours at 70-80° C. with stirring to give a polyurethane PREPOLY-MER-2 without un-reacted isocyanate groups and functionalized with unsaturated double bonds of methacrylate groups.

Synthesis 3

164.8 g poly(propylene-ethylene) glycol diol-HO $(C_3H_5O)n(C_2H_5O)mH$ (having a number average molecular weight of about 3000 Da) and 235.2 g polypropylene glycol diol (having number average molecular weight of 3000 Da) were reacted with 30.4 g of a mixture 2,4-toluene diisocyanate and 2,6-toluene diisocyanate in a weight ratio 80 to 20 (MONDUR TD-80 Grade A, Bayer) in the presence of 0.237 g dibutyltin dilaurate at 65-75° C. for 2-3 hours with stirring to give an isocyanate-terminated polyglycol. The resulting oligomer was further reacted with 30.4 g polypropyleneglycol monomethacrylate—(SR604A, Sartomer) for 2 hours at 70-80° C. with stirring to give a polyurethane PREPOLY-MER-3 without un-reacted isocyanate groups and functionalized with unsaturated double bonds of methacrylate groups.

EXAMPLE 1

To 123.0 g of PREPOLYMER-1 obtained in Synthesis 1, there were added 55.3 g polypropylene glycol monomethacrylate (SR604, Sartomer Company, Inc.), 1.2 g trimethylolpropane trimethacrylate (SR350, Sartomer Company, Inc.), 7.0 g diethylene glycol dimethacrylate (AGEFLEX DEGMA, Ciba Specialty Chemicals Corp.), 0.32 g butylated hydroxyl toluene (BHT, Merisol Antioxidants LLC), 2.0 g Tetradecanoic acid (KORTACID 1499.01, Akzo Nobel), and 2.0 g photoinitiator Irgacure 754 (Ciba Specialty Chemicals Corp) (a mixture of 30-60% Oxy-phenyl-acetic acid 2-[2-oxo-2-phenyl-acetoxy]-ethyl ester and 40-70% -Oxy-phenyl-acetic acid 2-[2-hydroxy-ethoxy]-ethyl ester (Ciba Specialty Chemicals Corp.)). The mixture was thoroughly mixed to give a uniform photosensitive composition.

The viscosities, physical properties and Yellowing Index (YI) of the photopolymer resins and hand stamp plates prepared according to the formulation above were as follows:

| Viscosity | 22 000-32 000 cP |
|---|---|
| Hardness, Shore A | 35-41 |
| Impact resilience | 22-35% |
| Tensile strength | 1000-1500 psi |
| Elongation | 200-300% |
| YI—Yellowing Index | |
| 15 min UV-light | 0.0245 |
| 30 min UV-light | 0.0313 |
| 45 min UV-light | 0.0323 |
| 3 hrs Sunlight | 0.0321 |

EXAMPLE 2

To 124.0 g of PREPOLYMER-2 obtained in Synthesis 2, there were added 55.6 g polypropylene glycol monomethacrylate (SR604, Sartomer Company, Inc.), 1.07 g trimethylolpropane trimethacrylate (SR350, Sartomer Company, Inc.), 5.3 g tripropyleneglycol diacrylate (TR-PGDA, Cytec Surface Specialties), 0.32 g butylated hydroxytoluene (BHT, Merisol Antioxidants LLC), 0.06 g 4-methoxyphenol (HQMME, Eastman Chemical Comp.), 2.0 g Tetradecanoic acid (KORTACID 1499.0, Akzo Nobel), and 1.04 g photoinitiator benzyl-dimethyl-ketal (Esacure KB-1, Sartomer Company), and the mixture was thoroughly mixed to give a uniform photosensitive composition.

The viscosities, physical properties and Yellowing Index (YI) of the photopolymer resins and hand stamp plates prepared according to the formulation above were as follows:

| Viscosity | 22 000-32 000 cP |
|---|---|
| Hardness, Shore A | 35-41 |
| Impact resilience | 37-43% |
| Tensile strength | 900-1400 psi |
| Elongation | 200-300% |
| YI—Yellowing Index | |
| 15 min UV-light | 0.0855 |
| 30 min UV-light | 0.0853 |
| 45 min UV-light | 01858 |
| 3 hrs Sunlight | 0.0376 |

EXAMPLE 3

To 140.6 g of PREPOLYMER-3 obtained in Synthesis 3, there were added 25.1 g polypropylene glycol monomethacrylate (SR604, Sartomer Company, Inc.), 1.72 g trimethylolpropane trimethacrylate (SR350, Sartomer Company, Inc.), 7.25 g diethylene glycol dimethacrylate (AGEFLEX DEGMA, Ciba Specialty Chemicals Corp.), 0.36 g butylated hydroxytoluene (BHT, Merisol Antioxidants LLC), 18.1 g n-lauryl methacrylate (LMA, Sartomer Company), 4.1 g diethylaminoethyl methacrylate (AGFLEX FM2, Ciba Specialty Chemicals Corp.), and 0.5 g photoinitiator benzyl-dimethyl-ketal (Esacure KB-1, Sartomer Company) and 1.72 g benzophenone (Schweizerhall, Inc.), and the mixture was thoroughly mixed to give a uniform photosensitive composition.

The viscosities, physical properties and Yellowing Index (YI) of the photopolymer resins and hand stamp plates prepared according to the formulation above were as follows:

| Viscosity | 28 000-40 000 cP |
|---|---|
| Hardness, Shore A | 25-33 |
| Impact resilience | 26-35% |
| Tensile strength | 800-1200 psi |
| Elongation | 250-350% |
| YI—Yellowing Index | |
| 15 min UV-light | 0.0786 |
| 30 min UV-light | 0.0917 |
| 45 min UV-light | 0.1867 |
| 3 hrs Sunlight | 0.0497 |

EXAMPLE 4

To 123.0 g of PREPOLYMER-1 obtained in Synthesis 1, there were added 55.3 g polypropylene glycol monomethacrylate (SR604, Sartomer Company, Inc.), 1.2 g trimethylolpropane trimethacrylate (SR350, Sartomer Company, Inc.), 7.0 g diethylene glycol dimethacrylate (AGE-FLEX DEGMA, Ciba Specialty Chemicals Corp.), 0.32 g butylated hydroxytoluene (BHT, Merisol Antioxidants LLC), 2.0 g Tetradecanoic acid (KORTACID 1499.01, Akzo Nobel), and 1.0 g photoinitiator benzyl-dimethyl-ketal (Esacure KB-1, Sartomer Company), and the mixture was thoroughly mixed to give a uniform photosensitive composition. This composition is the same as used in Example 1, but a different photoinitiator is used.

The viscosities, physical properties and Yellowing Index (YI) of the photopolymer resins and hand stamp plates prepared according to the formulation above were as follows:

| Viscosity | 22 000-32 000 cP |
|---|---|
| Hardness, Shore A | 35-41 |
| Impact resilience | 25-35% |
| Tensile strength | 1000-1500 psi |
| Elongation | 200-300% |
| YI—Yellowing Index | |
| 15 min UV-light | 0.0285 |
| 30 min UV-light | 0.0372 |
| 45 min UV-light | 0.0427 |
| 3 hrs Sunlight | 0.0363 |

EXAMPLE 5

To 123.0 g of PREPOLYMER-1 obtained in Synthesis 1, there were added 55.3 g polypropylene glycol monomethacrylate (SR604, Sartomer Company, Inc.), 1.2 g trimethylolpropane trimethacrylate (SR350, Sartomer Company, Inc.), 7.0 g diethylene glycol dimethacrylate (AGE-FLEX DEGMA, Ciba Specialty Chemicals Corp.), 0.32 g butylated hydroxytoluene (BHT, Merisol Antioxidants LLC), 2.0 g Tetradecanoic acid (KORTACID 1499.01, Akzo Nobel), and 2.0 g photoinitiator 1-hydroxy-cyclohexyl-phenyl-ketone (Irgacure 184, Ciba Specialty Chemicals Corp.), and the mixture was thoroughly mixed to give a uniform photosensitive composition. This composition is the same as used in Example 1, but with a different photoinitiator.

The viscosities, physical properties and Yellowing Index (YI) of the photopolymer resins and hand stamp plates prepared according to the formulation above were as follows:

| Viscosity | 22 000-32 000 cP |
|---|---|
| Hardness, Shore A | 35-41 |
| Impact resilience | 22-30% |
| Tensile strength | 800-1100 psi |
| Elongation | 150-250% |
| YI—Yellowing Index | |
| 15 min UV-light | 0.0721 |
| 30 min UV-light | 0.1064 |
| 45 min UV-light | 0.1039 |
| 3 hrs Sunlight | 0.0369 |

EXAMPLE 6

To 123.0 g of PREPOLYMER-1 obtained in Synthesis 1, there were added 55.3 g polypropylene glycol monomethacrylate (SR604, Sartomer Company, Inc.), 1.2 g trimethylolpropane trimethacrylate (SR350, Sartomer Company, Inc.), 7.0 g diethylene glycol dimethacrylate (AGE-FLEX DEGMA, Ciba Specility Chemicals Corp.), 0.32 g butylated hydroxytoluene (BHT, Merisol Antioxidants LLC), 2.0 g Tetradecanoic acid (KORTACID 1499.01, Akzo Nobel), and 2.0 g photoinitiator mixture of 80% 2-hydroxy-2methyl-1-phenyl-propan-1-one and 20% 1-hydroxy-cyclohexyl-phenyl-ketone (Irgacure 1000, Ciba Specialty Chemicals Corp.), and the mixture was thoroughly mixed to give a uniform photosensitive composition. This composition is also the same as used in Example 1, but with a different photoinitiator.

The viscosities, physical properties and Yellowing Index (YI) of the photopolymer resins and hand stamp plates prepared according to the formulation above were as follows:

| Viscosity | 22 000-32 000 cP |
|---|---|
| Hardness, Shore A | 35-41 |
| Impact resilience | 22-30% |
| Tensile strength | 800-1100 psi |
| Elongation | 150-250% |
| YI—Yellowing Index | |
| 15 min UV-light | 0.0438 |
| 30 min UV-light | 0.0762 |
| 45 min UV-light | 0.1651 |
| 3 hrs Sunlight | 0.0383 |

EXAMPLE 7

To 123.0 g of PREPOLYMER-1 obtained in Synthesis 1, there were added 55.3 g polypropylene glycol monomethacrylate (SR604, Sartomer Company, Inc.), 1.2 g trimethylolpropane trimethacrylate (SR350, Sartomer Company, Inc.), 7.0 g diethylene glycol dimethacrylate (AGE-FLEX DEGMA, Ciba Specility Chemicals Corp.), 0.32 g butylated hydroxytoluene (BHT, Merisol Antioxidants LLC), 2.0 g Tetradecanoic acid (KORTACID 1499.01, Akzo Nobel), and 2.0 g photoinitiator mixture of 80% Irgacure 754 (Ciba Specility Chemicals Corp.) and 20% Esacure KB-1 (Sartomer Company), and the mixture was thoroughly mixed to give a uniform photosensitive composition. This composition is also the same as used in Example 1, but the photoinitiator is a mixture of the photoinitiator from Example 1 and Example 4.

The viscosities, physical properties and Yellowing Index (YI) of the photopolymer resins and hand stamp plates prepared according to the formulation above were as follows:

| Viscosity | 22 000-32 000 cP |
|---|---|
| Hardness, Shore A | 35-41 |
| Impact resilience | 22-30% |
| Tensile strength | 800-1100 psi |
| Elongation | 150-250% |
| YI—Yellowing Index | |
| 15 min UV-light | 0.0556 |
| 30 min UV-light | 0.0438 |
| 45 min UV-light | 0.0520 |
| 3 hrs Sunlight | 0.0748 |

It should be emphasized that the above-described embodiments of the present packaging apparatus, particularly, any "preferred" embodiments, are merely possible examples of implementations and merely set forth for a clear understanding of the principles of the invention. Many variations and modifications may be made to the above-described embodiment(s) without departing substantially from the spirit and principles of the invention. All such modifications and variations are intended to be included herein within the scope of this disclosure and protected by the following claims.

What is claimed is:

1. A photosensitive composition comprising:
    at least one aliphatic polyether urethane (meth)acrylate oligomer having an average of about 2.0 (meth)acrylate groups per molecule, wherein the aliphatic polyether urethane (meth)acrylate oligomer is present in an amount of about 50 to 75% by weight of the total composition;
    at least one reactive diluent selected from the group consisting of: mono-(meth)acrylate esters, di-(meth)acrylate esters, poly-(meth)acrylate esters, and mixtures thereof, wherein the reactive diluent is present in an in amount of about 20 to 50% by weight of the total composition; and
    a mixture of two or more photoinitiators, wherein at least one photoinitiator is selected from the group of aromatic α-ketocarboxylic acid esters and at least one photoinitiator is selected from the group consisting of: benzoin and benzoinether derivatives, benzyl ketal derivatives, α,α-dialkyloxyacetophenone derivatives, α-hydroxyalkylphenone derivatives, α-aminoalkylphenone derivatives, acylphosphine oxide, acyl phosphine sulfides, α-ketocarboxylic acids and their esters, aromatic α-ketocarboxylic acids and their esters, O-acyl-α-oximino ketone derivatives, benzophenone and its derivatives, Michler's ketone, thioxanthone and its derivatives, metalocene compounds, bisimidazole and their derivatives, and polymer-bond compounds in amount of about 0.1 to 10% by weight of the total composition, wherein the photoinitiator provides reduced yellowing of the composition after curing.

2. A photosensitive composition comprising:
    at least one aliphatic polyether urethane (meth)acrylate oligomer having an average of about 2.0 (meth)acrylate groups per molecule, wherein the aliphatic polyether urethane (meth)acrylate oligomer is present in an amount of about 50 to 75% by weight of the total composition;
    at least one reactive diluent selected from the group consisting of: mono-(meth)acrylate esters, di-(meth)acrylate esters, poly-(meth)acrylate esters, and mixtures thereof, wherein the reactive diluent is present in an in amount of about 20 to 50% by weight of the total composition; and
    a photoinitiator comprising a mixture of oxy-phenyl-acetic acid 2-[2oxo-2-phenyl-acetoxy-etyoxy]-ethyl ester and oxy-phenyl-acetic 2-[2-hydroxy-ethoxy]-ethyl ester in amount of about 0.1 to 10% by weight of the total composition, wherein the photoinitiator provides reduced yellowing of the composition after curing.

3. A photosensitive composition comprising:
    at least one aliphatic polyether urethane (meth)acrylate oligomer having an average of about 2.0 (meth)acrylate groups per molecule;
    at least one reactive diluent selected from the group consisting of: mono-(meth)acrylate esters, di-(meth)acrylate esters, poly-(meth)acrylate esters, and mixtures thereof; and
    a photoinitiator comprising a mixture of oxy-phenyl-acetic acid 2-[2oxo-2-phenyl-acetoxy-ethoxy]-ethyl ester and oxy-phenyl-acetic 2-[2-hydroxy-ethoxy]-ethyl ester, wherein the photoinitiator provides reduced yellowing of the composition after curing.

4. The photosensitive composition of claim 3, wherein the photoinitiator comprises about 30 to 60% oxy-phenyl-acetic acid 2-[2-oxo-2-phenyl-acetoxy]-ethyl ester and about 40 to 70% oxy-phenyl-acetic acid 2-[2-hydroxy-ethoxy]-ethyl ester.

5. The photosensitive composition of claim 3, wherein the aliphatic polyether urethane (meth)acrylate oligomer is present in an amount of about 50 to 75% by weight of the total composition, the least one reactive diluent is present in an amount of about 20 to 35% by weight of the total composition, and the photoinitiator is present in an amount of about 0.2 to 5% by weight of the total composition.

6. A photosensitive composition comprising:
    at least one aliphatic polyether urethane (meth)acrylate oligomer having an average of about 2.0 (meth)acrylate groups per molecule, wherein the aliphatic polyether urethane (meth)acrylate oligomer is present in an amount of about 50 to 75% by weight of the total composition;
    at least one reactive diluent selected from the group consisting of: mono-(meth)acrylate esters, di-(meth)acrylate esters, poly-(meth)acrylate esters, and mixtures thereof, wherein the reactive diluent is present in an in amount of about 20 to 50% by weight of the total composition; and
    a photoinitiator comprising: a mixture of oxy-phenyl-acetic acid 2-[2oxo-2-phenyl-acetoxy-etyoxy]-ethyl ester and oxy-phenyl-acetic 2-[2-hydroxy-ethoxy]-ethyl ester in amount of about 0.1 to 10% by weight of the total composition, wherein the photoinitiator provides reduced yellowing of the composition after curing.

7. A photosensitive composition comprising:
    at least one aliphatic polyether urethane (meth)acrylate oligomer having an average of about 2.0 (meth)acrylate groups per molecule, wherein the aliphatic polyether urethane (meth)acrylate oligomer is present in an amount of about 50 to 75% by weight of the total composition, wherein the aliphatic polyether urethane (meth)acrylate oligomer comprises: the reaction product of poly(propylene-ethylene) glycol diol and polypropylene glycol diol with dicyclohexylmethane-4,4'-diisocyanate in the presence of dibutyltin dilaurate, further reacted with poly (propylene glycol) monomethacrylate;
    at least one reactive diluent selected from the group consisting of: mono-(meth)acrylate esters, di-(meth)acrylate esters, poly-(meth)acrylate esters, and mixtures thereof, wherein the reactive diluent is present in an in amount of about 20 to 50% by weight of the total composition, wherein the reactive diluent comprises a mixture of polypropylene glycol monomethacrylate, trimethylolpropane trimethacrylate, and diethylene glycol dimethacrylate; and
    at least one photoinitiator in amount of about 0.1 to 10% by weight of the total composition, wherein the photoinitiator provides reduced yellowing of the composition after curing, and wherein the photoinitiator is selected from the group consisting of: the compounds of formula I, II, and III, and mixtures thereof, wherein

Formula I is:

Formula II is:

Formula III is:

and wherein
Ar is an unsubstituted $C_6$-$C_{14}$-aryl radical or a mono-, di-, or tri-substituted $C_6$-$C_{14}$-aryl radical, wherein each substitution is independently selected from: a $C_1$-$C_4$-alkyl, a $C_1$-$C_4$-alkoxy, a phenoxy, a $C_1$-$C_4$-alkylthio, a phenylthio, and a halogen; and R is selected from a $C_1$-$C_{12}$-alkyl, a $C_5$-$C_6$-cycloalkyl, a $C_6$-$C_{10}$alkaryl, a $C_6$-$C_{10}$-alkaryl, and a $C_3$-$C_6$ alkoxyalkyl.

8. The photosensitive composition of claim 7, wherein the photoinitiator comprises about 30 to 60% oxy-phenyl-acetic acid 2-[2-oxo-2-phenyl-acetoxy]-ethyl ester and about 40 to 70% oxy-phenyl-acetic acid 2-[2-hydroxy-ethoxy]-ethyl ester.

9. A cured, raised relief article made from the photosensitive composition of claim 8.

* * * * *